United States Patent [19]

Reynolds

[11] 3,748,596

[45] July 24, 1973

[54] MULTIPLE DIODE COAXIAL CAVITY OSCILLATOR WITH MANUAL AND VARACTOR DIODE TUNING

[75] Inventor: Allan L. Reynolds, White Plains, N.Y.

[73] Assignee: International Telephone and Telegraph Corporation, Nutley, N.J.

[22] Filed: Mar. 14, 1972

[21] Appl. No.: 234,583

[52] U.S. Cl. ......... 331/101, 331/107 R, 331/107 G, 331/177 V, 332/30 V, 333/82 B

[51] Int. Cl. ........................................... H03b 7/14

[58] Field of Search ..................... 331/96, 101, 102, 331/107 R, 107 G, 177 V; 330/56; 333/73 C, 82 B; 332/30 V

[56] References Cited

UNITED STATES PATENTS 3,509,478 4/1970 Thim ............................ 331/101 X

OTHER PUBLICATIONS

Troughton, "An Evaluation Circuit for Fundamental and Harmonically Tuned GaAs Devices," Proc. of IEEE, July 1970, pp. 1165, 1166.

*Primary Examiner*—Roy Lake
*Assistant Examiner*—Siegfried H. Grimm
*Attorney*—C. Cornell Remsen, Jr., Philip M. Bolton and Menotti J. Lombardi, Jr. et al.

[57] ABSTRACT

A novel coaxial line cavity oscillator is disclosed which enables the oscillation outputs of two or more Gunn or Impatt diodes to be efficiently combined over relatively broad radio frequency ranges. The two or more diodes are directly connected between the inner and outer conductors of the coaxial line cavity. Continuous frequency tuning is accomplished by mechanically adjusting a capacitive sliding shorting arrangement disposed between the inner and outer conductor of the coaxial line cavity. A varactor diode tuning arrangement is also provided where the varactor diode is disposed to be coupled into the coaxial cavity between the two or more Gunn or Impatt diodes and the mechanical capacitive sliding shorting arrangement. This frequency tuning arrangement is free from breakup, mode jumping, skipping, hysteresis effects or any other type of tuning irregularity ususally encountered when the oscillation outputs of two or more diodes are conventionally combined.

10 Claims, 2 Drawing Figures

MULTIPLE DIODE COAXIAL CAVITY OSCILLATOR WITH MANUAL AND VARACTOR DIODE TUNING

BACKGROUND OF THE INVENTION

This invention relates to oscillators and in particular to multiple diode cavity oscillators.

In the past several years, steady and sometimes dramatic progress has been made in the performance capabilities and cost reductions of Gunn diodes. These developments have put the Gunn devices in a very strong, if not superior position in many areas that were reserved for the transistor-step recovery diode multiplier chain for the generation of microwave power. The Gunn diode also seems to have the edge over the Impatt diode in those applications where relatively lower noise performance is preferred. The primary advantage of the Gunn diode lies in the fact that it offers direct DC (direct current) to RF (radio frequency) conversion in a rugged, self-contained, small volume package. This is a big attraction to systems designers and quality control people who see the absence of low frequency harmonics, interstage isolation requirements and a much smaller parts count as tangible advantages.

At the present time there is a great deal of interest in short-haul FM (frequency modulation) radio communication sets in C- and X-band having transmitter CW (continuous wave) power outputs in the one watt range. Recent technological advances in Gunn diode fabrication have yielded power outputs of a magnitude which places them in contention for this application.

Currently, individual Gunn diode chips or active layers capable of delivering one watt power levels are not available. The highest X-band power levels that are obtainable at present are limited to about 500 milliwatts. However, there are several approaches which can be employed to achieve higher power levels within the framework of the existing technology. These include the fabrication of multiple mesas on a single stud in which several active regions are etched onto a substrate and are then connected in parallel. Such an arrangement is described in the article of S. Mitsui, "CW Gunn Diodes In A Composite Structure," IEEE Transactions on Microwave Theory and Techniques, Vol. MTT-17 pages 1158–1160, December 1969. Another method which is most useful for single frequency applications is the use of hybrid techniques to combine the output powers of several individual oscillators. A third approach, which is the approach used in the present application, is the combining of two or more Gunn diodes in parallel in a single resonant structure in order to obtain the necessary power levels.

This latter technique while conceptually simple and straight-forward can suffer from a variety of circuit associated instabilities. These are generally referred to as "moding" problems and can arise when two or more active sources share the same resonant circuit. In general, a "moding" situation will arise, if during the starting transient, the circuit encourages an out-of-phase RF condition to exist between each source. This phenomena has hindered the general development of multi-source oscillators and is especially bothersome in the case of the Gunn diode since the Gunn effect exhibits a negative resistance over a relatively broad frequency range.

Several interesting solutions to this problem have recently appeared in the literature for the case of Impatt diodes. The following two articles are of interest in this area: C.T. Rucker, "A Multiple-Diode High Average Power Avalanche Diode Oscillator," IEEE Transactions on Microwave Theory and Techniques, Volume MTT-17, December 1969, pages 1,156–1158 and K. Kurokawa, "The Single Cavity Multiple-Device Oscillator", IEEE Transactions on Microwave Theory and Techniques, Volume MTT-19, No. 10, October 1971. The solution presented in these articles employs resistive loading to present dissipation at frequencies other than the desired one to discourage unwanted resonances while presenting negligible insertion loss at the desired frequency.

SUMMARY OF THE INVENTION

An object of the present invention is to provide a novel multiple diode cavity oscillator, where the diodes are Gunn or Impatt diodes, which does not involve resistive stabilization techniques of the prior art.

Another object of the present invention is to provide a simple Gunn or Impatt diode cavity oscillator which is free of "moding" instabilities and combines the output of Gunn diode pairs to yield 0.6 to 1.2 watts with overall efficiencies between 1.3 and 3.2 percent over the 7.1 to 8.4 gigahertz (GHz) communication band as a function of a single mechanical tuning control.

A feature of the present invention is the provision of a broad band multiple diode cavity oscillator comprising: a coaxial line cavity having an inner and an outer conductor; N diodes selected from those diode types consisting of Gunn and Impatt diode types, where N is an integer greater than one, each of the N diodes being of the same diode type and directly connected between the inner conductor and the outer conductor with an orientation with respect to the inner conductor and the outer conductor to oscillate at a frequency within a given broad radio frequency range; first means disposed adjacent one end of the inner conductor to couple a DC bias voltage to the inner conductor and, hence, to the N diodes; second means disposed adjacent the other end of the inner conductor to provide an output radio frequency signal having a frequency in the given broad radio frequency range, the output signal resulting from the combined oscillation of each of the N diodes; and third means disposed adjacent the one end of the inner conductor and in a sliding relation between the inner conductor and the outer conductor to tune the coaxial line cavity through the given broad radio frequency range.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENT

Figures 1, 2:
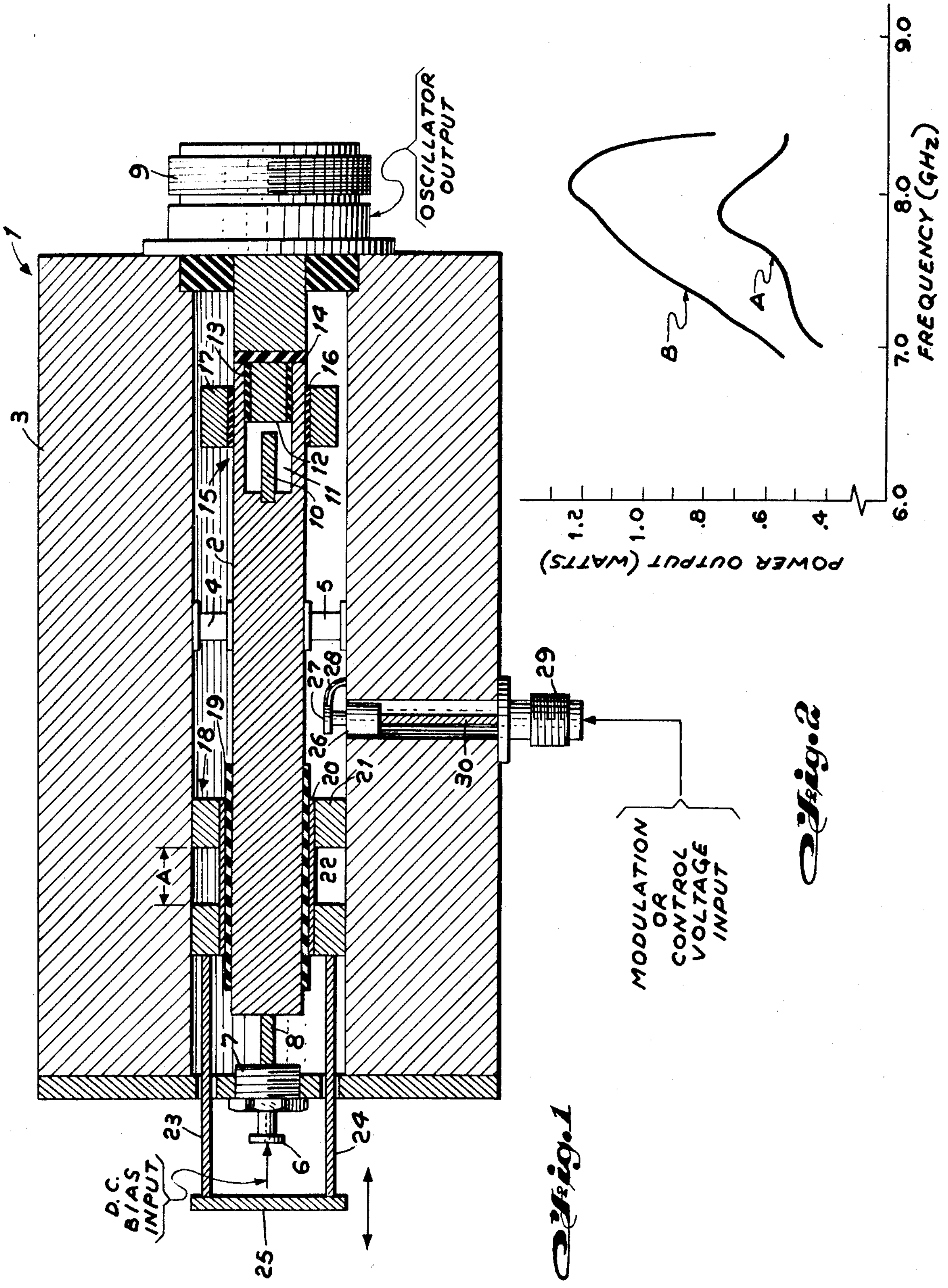
FIG. 1 is a longitudinal cross-sectional view, partially in elevation, of a multiple diode cavity oscillator in accordance with the principles of the present invention.
FIG. 2 illustrates the power output versus frequency for two different pairs of diodes employed in the cavity oscillator of FIG. 1.

Referring to FIG. 1, there is illustrated therein a broadband multiple diode cavity oscillator in accordance with the principles of the present invention which includes a coaxial line cavity 1 having an inner conductor 2 and an outer conductor 3 having a 50 ohm impedance. The outer conductor 3 is relatively massive and composed of copper to serve as a heat sink for the oscillator of the present invention as well as the outer conductor of the coaxial line cavity 1. Two packaged Gunn diodes, such as Gunn diodes 4 and 5, are mounted in shunt relationship between inner conductor 2 and outer conductor 3. In the illustration of FIG. 1 N is equal to two but the principles presented herein can be extended to include more than two diode pacakges and also the diodes may be of the Impatt type rather than the Gunn type diodes.

A DC bias voltage is coupled to terminal 6 and, hence, through a low pass filter 7 in the form of a feedthrough capacitor to one end of inner conductor 2 by means of conductor 8. With this arrangement the DC bias voltage is appropriately connected by means of inner conductor 2 to the diodes 4 and 5 which are oriented with respect to inner conductor and outer conductor 3 and the bias voltage applied to inner conductor 2 for oscillation at a selected frequency within a given broad radio frequency range.

The combined oscillations from diodes 4 and 5 are coupled through the coaxial line to a type N coaxial output connector 9 through a broadband DC blocking arrangement formed within inner conductor 2. This broadband DC blocking arrangement consists of a high impedance line 10 pressed into the bottom of a axial bore 11 in inner conductor 2. The length of conductor 10 is equal to one quarter wavelength at the center frequency of the given broad radio frequency range. Adjacent the end of conductor 10 and spaced therefrom is a low impedance line 12 inserted in bore 11 as illustrated. Line 12 is supported in its axial position in bore 11 of inner conductor 2 by a layer of electrical insulating material 13, such as Teflon. Disposed in a transverse relationship to the longitudinal axis of inner conductor 2 and abutting the end of line 12 remote from line 10 is a spacer 14 of electrical insulating material, such as Teflon.

The proper value of low resistance for the combined oscillations of diodes 4 and 5 is obtained by means of a quarter wavelength 40 ohm single slug transformer 15 whose position can be easily varied along the output line or inner conductor 2. Transformer 15 includes a layer 16 of electrical insulating material, such as Teflon or Rexolite and an annular metallic member 17. Member 17 may be composed of brass. The length of transformer 15 is one quarter wavelength long at the center frequency of the given broad radio frequency range.

A single mechanical tuning arrangement 18 which may be mechanically moved for tuning cavity 1 through a broad radio frequency range is illustrated. This mechanical tuning arrangement includes a layer of electrical insulating material 19, such as Teflon tape wrapped around the outer surface of inner conductor 2, a tubular metallic shell 20 which slidably engages the outer surface of tape 19 and first and second metallic annular members 21 and 22. The inner surfaces of members 21 and 22 are secured to tubular member 20 while their outer surfaces slidably engage the inner surface of outer conductor 3. The spacing A between members 21 and 22 is equal to one quarter wavelength at the center frequency of the broad radio frequency range. The resultant capacitive shorting tuning arrangement 18 is moved along inner conductor 2 in sliding engagement with outer conductor 3 and insulating layer 19 by the arrangement including rods 23 and 24 and handle 25.

A small amount of voltage controlled frequency deviation (plus or minus 5 megahertz) is obtained by a varactor tuning diode 26 having its cathode 27 disposed in the coaxial line cavity 1 in spaced relation with inner conductor 2 and outer conductor 3 and loop 28 interconnecting cathode 27 and outer conductor 3. The modulation or frequency controlled voltage is coupled through coupler 29 and conductor 30 to the anode of varactor diode 26.

The cavity oscillator built in accordance with the illustration of FIG. 1 used two distinct pairs of Gunn diodes to evaluate the operation of the multiple diode cavity oscillator of the present invention. The two pairs of diodes will be referred herein as type A and type B. These two pairs of diodes A and B were obtained from two different vendors and had $nl$ products of the order of $0.6 \times 10^{12}$ $cm^{-2}$ and thermal resistances of about 10°C/watt, where $n$ = doping density of active layer in units of $1/cm^3$, *l = length of active layer in units of cm, cm = centimeter and C* = centigrade. The test procedure to determine how well the oscillator of FIG. 1 combines the output powers of the individual diodes was obtained by comparing the DC power input to RF power output conversion efficiency for a singly mounted and the dual diode configurations of the present invention.

The following table illustrates the operating conditions of the two types of diodes employed.

| Dual Diode Type | Power Input (watts) | Operating Point VDC (volts) | IDC (amps) |
|---|---|---|---|
| A | 24 | 12 | 2 |
| B | 50 | 11.8 | 4.2 |

Referring to FIG. 2, there is illustrated herein the results of the tests made. The best power output obtained from the singly mounted type A diode under broadband tuning conditions was in the 0.3 to 0.4 watt range from 7.1 to 8.4 GHz with conversion efficiencies of 2.5 to 3.3 percent. When the two type A diode were mounted in the coaxial line cavity 1, output powers of 0.44 to 0.77 watts were obtained over the same frequency range with efficiencies of 1.8 to 3.2 percent. As it will be observed the conversion efficiencies of the dual diode arrangements compares favorably with the singly mounted diode arrangement. Curve A, FIG. 2 illustrates the power output verses frequency curve of the type A diodes in the dual diode cavity oscillator of FIG. 1.

The test results were quite similar for the type B diodes. The best singly mounted diode output power was in the 0.45 to 0.62 watt range from 7.1 to 8.4 GHz with conversion efficiencies of 1.7 to 2.9 percent. The dual diode configuration of FIG. 1 resulted in power outputs of 0.66 to 1.25 watts over the same frequency band with conversion efficiencies of 1.3 to 2.5 percent. This is illustrated in Curve B of FIG. 2.

The dual diode cavity arrangement of the present invention, as illustrated in FIG. 1, is a simple and effective means of achieving one watt or more power levels over a relatively broad, single-knob tunable frequency range in X-band.

While I have described above the principles of my invention in connection with specific apparatus it is to be clearly understood that this description is made only by way of example and not as a limitation to the scope of my invention as set forth in the objects thereof and in the accompanying claim.

I claim:

1. A broadband multiple diode cavity oscillator comprising:
a coaxial line cavity having an inner conductor and an outer conductor;
N negative resistance diodes, where N is an integer greater than one, each of said N diodes being of the same diode type and directly connected between said inner conductor and said outer conductor with an orientation with respect to said inner conductor and said outer conductor to oscillate at a frequency within a given broad frequency range;
first means disposed adjacent one end of said inner conductor to couple a DC bias voltage to said inner conductor and, hence, to said N diodes;
second means disposed adjacent the other end of said inner conductor to provide an output radio frequency signal having a frequency in said given broad radio frequency range, said output signal resulting from the combined oscillation of each of said N diodes; and
third means disposed adjacent said one end of said inner conductor and in a sliding relation between said inner conductor and said outer conductor to tune said coaxial line cavity through said given broad radio frequency range; said second means including
a broadband DC blocking arrangement formed within said inner conductor adjacent said other end of said inner conductor having
a high impedance one-quarter wavelength line disposed adjacent said N diodes and in a longitudinal relation to said inner conductor,
a low impedance one-quarter wavelength line spaced from said high impedance line remote from said N diodes and in a longitudinal relation to said inner conductor, and
a spacer of electrical insulation disposed in a transverse relation to said inner conductor abutting the end of said low impedance line remote from said high impedance line, said spacer having a diameter equal to the diameter of said inner conductor; and
a one-quarter wavelength impedance transformer having
a layer of electrical insulation encircling said inner conductor and
a metallic annular member encircling said layer, said annular member having an inner surface in sliding contact with the outer surface of said layer and an outer surface in spaced relation with the inner surface of said outer conductor.

2. An oscillator according to claim 1, wherein each of said N diodes are Gunn diodes.

3. An oscillator according to claim 1, wherein each of said N diodes are Impatt diodes.

4. An oscillator according to claim 1, wherein said first means includes
a low pass filter coupled to said one end of said inner conductor.

5. An oscillator according to claim 1, wherein said outer conductor provides a heat sink for said coaxial line cavity.

6. A broadband multiple diode cavity oscillator comprising:
a coaxial line cavity having an inner conductor and an outer conductor;
N negative resistance diodes, where N is an integer greater than one, each of said N diodes being of the same diode type and directly connected between said inner conductor and said outer conductor with an orientation with respect to said inner conductor and said outer conductor to oscillate at a frequency within a given broad radio frequency range;
first means disposed adjacent one end of said inner conductor to couple a DC bias voltage to said inner conductor and, hence, to said N diodes;
second means disposed adjacent the other end of said inner conductor to provide an output radio frequency signal having a frequency in said given broad radio frequency range, said output signal resulting from the combined oscillation of each of said N diodes; and
third means disposed adjacent said one end of said inner conductor and in a sliding relation between said inner conductor and said outer conductor to tune said coaxial line cavity through said given broad radio frequency range;
said third means including
a capacitive sliding shorting arrangement; said sliding shorting arrangement including
a layer of electrical insulation disposed on the outer surface of said inner conductor,
a tubular metallic shell disposed in a sliding relation on the outer surface of said layer,
a first metallic annular member disposed adjacent one end of and fixed to said shell, the outer surface of said first member slidably engaging the inner surface of said outer conductor, and
a second metallic annular member disposed adjacent the other end of and fixed to said shell, the outer surface of said second member slidably engaging the inner surface of said outer conductor,
said first and second member being spaced lonitudinally from each other by one-quarter wavelength at the center frequency of said given broad radio frequency range.

7. A broadband multiple diode cavity oscillator comprising:
a coaxial line cavity having an inner conductor and an outer conductor;
N negative resistance diodes, where N is an integer greater than one, each of said N diodes being of the same diode type and directly connected between said inner conductor and said outer conductor with an orientation with respet to said inner conductor and said outer conductor to oscillate at a frequency within a given broad radio frequency range;
first means disposed adjacent one end of said inner conductor to couple a DC bias voltage to said inner conductor and, hence, to said N diodes;
second means disposed adjacent the other end of said inner conductor to provide an output radio frequency signal having a frequency in said given broad radio frequency range, said output signal resulting from the combined oscillation of each of said N diodes;
third means disposed adjacent said one end of said inner conductor and in a sliding relation between said inner conductor and said outer conductor to tune said coaxial line cavity through said given broad radio frequency range;

a varactor diode having an anode and a cathode, at least said cathode extending into said coaxial line cavity in spaced relation with respect to said inner conductor and said outer conductor;

a metallic loop disposed within said coaxial line cavity interconnecting said cathode and said outer conductor; and fourth means coupled to said anode to couple a given signal to said varactor to deviate the frequency of said output radio frequency signal.

8. A broadband multiple diode cavity oscillator comprising:

a coaxial line cavity having an inner conductor and an outer conductor;

N negative resistance diodes, where N is an integer greater than one, each of said N diodes being of the same diode type and directly connected between said inner conductor and said outer conductor with an orientation with respect to said inner conductor and said outer conductor to oscillate at a frequency within a given broad radio frequency range;

first means disposed adjacent one end of said inner conductor to couple a DC bias voltage to said inner conductor and, hence, to said N diodes;

second means disposed adjacent the other end of said inner conductor to provide an output radio frequency signal having a frequency in said given broad radio frequency range, said output signal resulting from the combined oscillation of each of said N diodes; and third means disposed adjacent said one end of said inner conductor and in a sliding relation between said inner conductor and said outer conductor to tune said coaxial line cavity through said given broad radio frequency range;

said first means including a low pass filter coupled to said one end of said inner conductor;

said outer conductor providing a heat sink for said coaxial line cavity;

said second means including a broadband DC blocking arrangement formed within said inner conductor adjacent said other end of said inner conductor having a high impedance one-quarter wavelength line disposed adjacent said N diodes and in a longitudinal relation to said inner conductor, a low impedance one-quarter wavelength line spaced from said high impedance line remote from said N diodes and in a longitudinal relation to said inner conductor, and a spacer of electrical insulation disposed in a transverse relation to said inner conductor abutting the end of said low impedance line remote from said high impedance line, said spacer having a diameter equal to the diameter of said inner conductor; and a one-quarter wavelength impedance transformer having a first layer of electrical insulation encircling said inner conductor and a metallic annular member encircling said first layer, said annular member having an inner surface in sliding contact with the outer surface of said first layer and an outer surface in spaced relation with the inner surface of said outer conductor; and said third means including a second layer of electrical insulation disposed on the outer surface of said inner conductor, a tubular metallic shell disposed in a sliding relation on the outer surface of said second layer, a first metallic annular member disposed adjacent one end of and fixed to said shell, the outer surface of said first member slidably engaging the inner surface of said outer conductor, and a second metallic annular member disposed adjacent the other end of and fixed to said shell, the outer surface of said second member slidably engaging the inner surface of said outer conductor, said first and second member being spaced longitudinally from each other by one-quarter wavelength at the center frequency of said given broad radio frequency range.

9. An oscillator according to claim 8, further including a transverse opening through said outer conductor intermediate said second member and said N diodes, a varactor diode having an anode and a cathode, said varactor diode being disposed in said transverse opening so that at least said cathode extends into said coaxial line cavity in spaced relation with respect to said inner conductor and said outer conductor, and a metallic loop disposed within said coaxial line cavity between said second member and said N diodes interconnecting said cathode and said outer conductor, and a conductor coupled to said anode disposed coaxial of said transverse opening to couple a given signal to said varactor to deviate the frequency of said output radio frequency signal.

10. An oscillator according to claim 9, wherein N is equal to 2.

* * * * *